(12) United States Patent
Lawrence

(10) Patent No.: US 6,738,861 B2
(45) Date of Patent: May 18, 2004

(54) SYSTEM AND METHOD FOR MANAGING DATA IN MEMORY FOR REDUCING POWER CONSUMPTION

(75) Inventor: Richard H. Lawrence, Hudson, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/957,370

(22) Filed: Sep. 20, 2001

(65) Prior Publication Data

US 2003/0056067 A1 Mar. 20, 2003

(51) Int. Cl.⁷ .............................................. G06F 12/00
(52) U.S. Cl. ........................ 711/106; 711/156; 365/203; 365/222; 365/227; 713/320
(58) Field of Search ........................... 365/203, 222, 365/227; 711/106, 156, 166, 170, 171, 172, 173; 713/320

(56) References Cited

U.S. PATENT DOCUMENTS

| | | | | | |
|---|---|---|---|---|---|
| 5,331,601 A | * | 7/1994 | Parris | ..................... | 365/230.08 |
| 5,875,143 A | * | 2/1999 | Ben-Zvi | ..................... | 365/222 |
| 6,215,714 B1 | * | 4/2001 | Takemae et al. | ............ | 365/222 |
| 6,292,933 B1 | * | 9/2001 | Bahrs et al. | ................ | 717/107 |
| 6,311,280 B1 | * | 10/2001 | Vishin | ........................ | 713/320 |
| 6,341,097 B1 | * | 1/2002 | Hsu et al. | .................... | 365/222 |
| 6,349,068 B2 | * | 2/2002 | Takemae et al. | ............ | 365/222 |
| 2002/0138690 A1 | * | 9/2002 | Simmonds et al. | ......... | 711/106 |

* cited by examiner

Primary Examiner—Donald Sparks
Assistant Examiner—Christian P. Chace
(74) Attorney, Agent, or Firm—Kenneth M. Seddon

(57) ABSTRACT

A system or method to partition data in a memory based at least in part to a data type, and to refresh the memory based at least in part to the data type.

14 Claims, 4 Drawing Sheets

| BINARY VALUE | BANKS TO REFRESH |
|---|---|
| 0 0 0 | ALL BANKS |
| 0 0 1 | BANK 0 AND 1 |
| 0 1 0 | BANK 0 |
| 0 1 1 | RFU |
| 1 0 0 | RFU |
| 1 0 1 | BANK 0 |
| 1 1 0 | BANK 0 |
| 1 1 1 | RFU |

| BINARY VALUE | BANKS TO REFRESH |
|---|---|
| 0 0 0 | ALL BANKS |
| 0 0 1 | BANK 0 AND 1 |
| 0 1 0 | BANK 0 |
| 0 1 1 | RFU |
| 1 0 0 | RFU |
| 1 0 1 | BANK 0 |
| 1 1 0 | BANK 0 |
| 1 1 1 | RFU |

FIG. 2

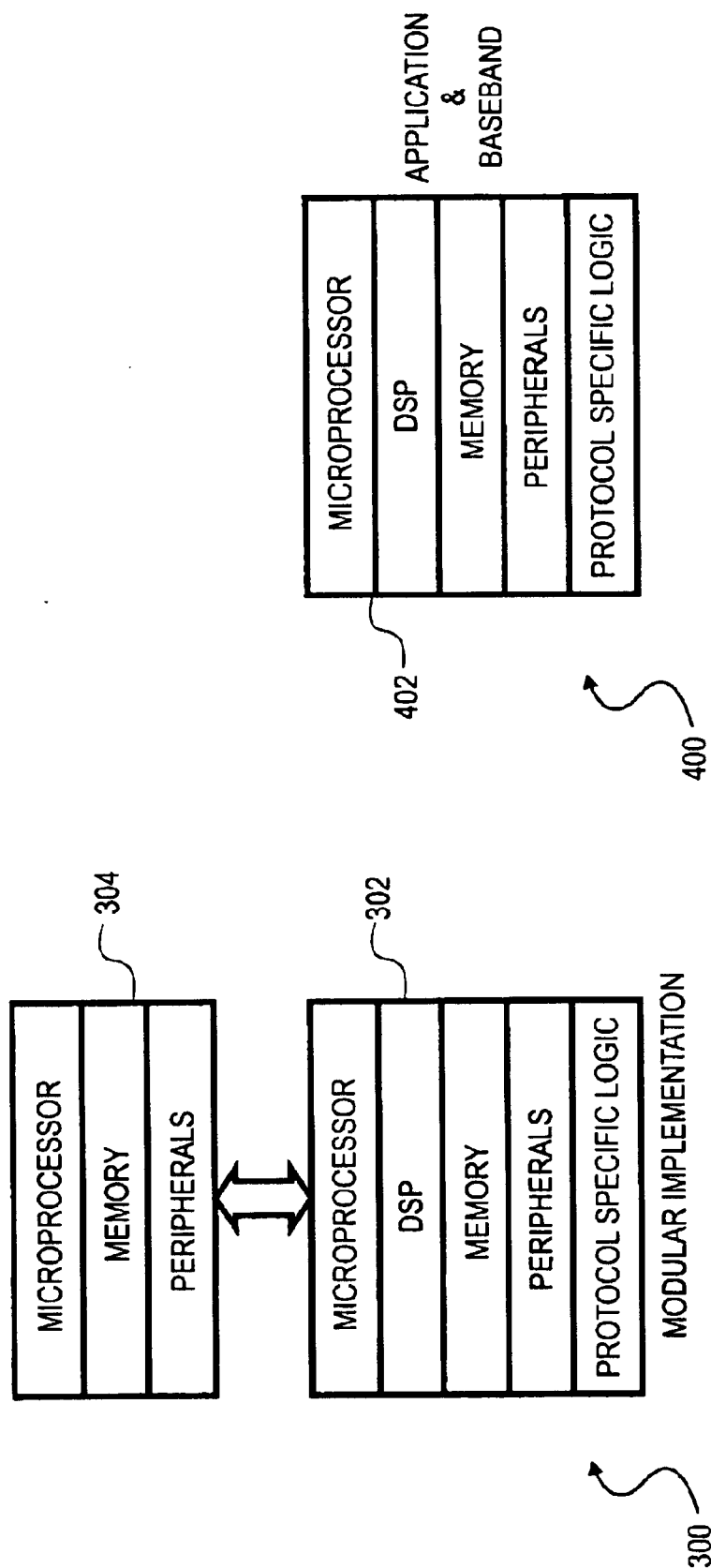

SYSTEM AND METHOD FOR MANAGING DATA IN MEMORY FOR REDUCING POWER CONSUMPTION

The claimed subject matter relates to organizing data in a memory for a refresh operation.

DESCRIPTION OF THE RELATED ART

The demand for more powerful computers and communication products has resulted in faster processors that often consume increasing amounts of power. However, design engineers struggle with reducing power consumption, for example, to prolong battery life, particularly in mobile and communication systems.

Communication products and computers utilize memories to store a variety of different information. For example, some information is temporary in nature because once the particular application is completed the information is no longer needed, thus, it is designated as a working storage data type. In contrast, some information is needed indefinitely or for a long-term, such as, application programs and utilities, and is designated a long-term data type.

A Dynamic Random Access Memory, DRAM, is a typical memory to store the previously described information types. DRAMs contain a memory cell array having a plurality of individual memory cells; each memory cell is coupled to one of a plurality of sense amplifiers, bit lines, and word lines. The memory cell array is arranged as a matrix of rows and columns, and the matrix is further subdivided into a number of banks.

The DRAM memory cell consists of a single transistor and a single capacitor and is dynamic because charge stored on the capacitor decays because of a various leakage current paths to surrounding cells and to the substrate. Typically, a refresh operation is performed on the DRAM memory cell to ensure the validity of the data. For example, the refresh operation is initiated by a memory controller to read the data from the cell array via the sense amplifiers and subsequently rewriting the data back into the cell array. Thus, the refresh operation restores the capacitor's charge to ensure the validity of the data.

Typically, Synchronous Dynamic Random Access Memories (SDRAMs) can support a self-refresh, which is a refresh operation executed by the SDRAM rather than the memory controller. During the self-refresh, the SDRAM utilizes an internal oscillator to generate refresh cycles to maintain the data in the memory cells. Presently, a low-power SDRAM allows for a subset of the memory to be refreshed with a partial-array self-refresh feature. For example, the partial-array self-refresh (PASR) feature for a four bank SDRAM allows for one, two, or four banks to be refreshed.

Typically, self-refresh features are not fully utilized to ensure a reduction in system power consumption because the SDRAM refreshes all the data, regardless of the data type.

BRIEF DESCRIPTION OF THE DRAWINGS

Subject matter is particularly pointed out and distinctly claimed in the concluding portion of the specification. The claimed subject matter, however, both as to organization and method of operation, together with objects, features, and advantages thereof, may best be understood by reference to the following detailed description when read with the accompanying drawings in which:

FIG. 2 is a register in accordance with one embodiment.

FIG. 3 is a schematic diagram of a computing system in accordance with one embodiment.

FIG. 4 is a schematic diagram of a computing system in accordance with one embodiment.

DETAILED DESCRIPTION

A system and a method for partitioning data for refreshing a dynamic random access memory are described. In the following description, for purposes of explanation, numerous details are set forth in order to provide a thorough understanding of the claimed subject matter. However, it will be apparent to one skilled in the art that these specific details are not required in order to practice the claimed subject matter.

An area of current technological development relates to achieving longer battery life for communication products and computer or computing systems by reducing power consumption. As previously described, memories do not partition data to determine the proper priority for self refresh operations. Alternatively, some data such as temporary data does not need to be refreshed, however, it is refreshed based at least in part on the lack of partitioned data. Thus, implementing a more efficient method of partitioning data in memory for a refresh operation to reduce power consumption is desirable.

Figure 1:
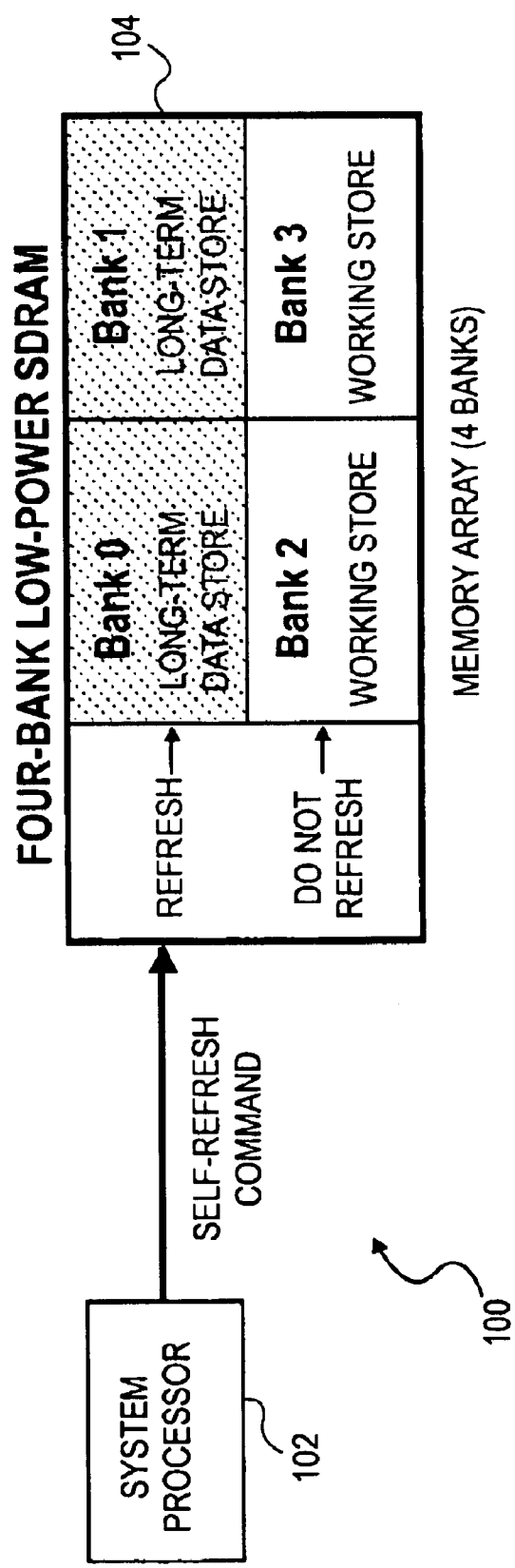
FIG. 1 is a schematic diagram of a computing system in accordance with one embodiment.

FIG. 1 is a schematic diagram of a computing system 100 in accordance with one embodiment. The system 100 comprises, but is not limited to, a system processor 102, and in one embodiment a low-power synchronous dynamic random access memory (SDRAM) 104. In this embodiment, the low-power SDRAM comprises four memory banks: bank 0, bank 1, bank 2, and bank 3. As discussed earlier, the low-power SDRAM supports a partial-array self-refresh that allows for a subset of the memory to be refreshed. For example, if a SDRAM has four memory banks, the partial-array self-refresh (PASR) allows for one, two, or four banks to be refreshed, or a fractional portion of a bank, such as, a fourth (¼) or a half (½). Of course, the claimed subject matter is not limited in this respect. For example, the claimed subject matter supports SDRAM with more than four banks, which is discussed further in connection with FIG. 2.

System 100 supports low-power SDRAM and any memory to incorporate partitioning of data for the purpose of efficient processing. As one example, the claimed subject matter supports partitioning data for efficient processing of refresh cycles to reduce power consumption. The system may comprise, for example, a personal computer system, a personal digital assistant (PDA), a cellular phone, or an Internet communication device, such as, a web tablet. Of course, these are merely examples and the claimed subject matter is not limited in scope to these examples. The claimed subject matter can also support wireless or wired products, which is discussed further in connection with FIG. 5.

Although the scope of the claimed subject matter is not limited in this respect, it is noted that some embodiments may include subject matter from the following co-pending applications: a first patent application with a serial number of 10/045,324, and with a Title of "A System and Method for Power Reduction", attorney docket number P11726, and with the inventor Richard H. Lawrence; and a second patent application with a Ser. No. of 09/957,428, and with a Title of "A System and Method for Power Reduction of a Memory", attorney docket number P11724, and with the inventor Richard H. Lawrence.

In one embodiment, a system software manages and partitions the different data types, long-term and working storage, and substantially maintains the data based at least in part on the data type. As one example, the software partitions working storage data type in banks 2 and 3, and long-term data type in banks 0 and 1. However, the claimed subject matter is not limited in this respect. One skilled in the art appreciates a variety of configurations on partitioning the data to different bank configurations. As another example, the software may partition working storage data into bank 0, and long-term data into banks 1, 2, and 3. Alternatively, another example is each bank may contain different data types, such as, bank 0 may contain a substantial portion of a long-term data type with a minor portion of working storage data type, or vice-versa. The previous example may be used if the memory has four banks and the working storage data type requires slightly more than one bank, and the long-term data type requires slightly less than three banks. Alternatively, the claimed subject matter supports more than the two previously discussed data types and is capable of supporting and partitioning a plurality of different data types.

In one embodiment, the system software is integrated into the system's operating system software and the system software may be loaded into a flash memory. In another embodiment, the system software is integrated into an application software that is loaded into a dynamic random access memory.

System processor 102 loads the system software and may decide which bank or banks need to be refreshed. For example, FIG. 1 illustrates the long-term data is stored in banks 0 and 1, and working storage data type is stored in banks 2 and 3. In one embodiment, the long-term data in banks 0 and 1 may be refreshed and the working storage data in banks 2 and 3 are not refreshed.

In one embodiment, in order to refresh a specific bank the system processor may issue a self-refresh command to the low-power SDRAM and the processor may write a value into a three-bit field in the low-power SDRAM's Extended Mode Register. The value in the three-bit field indicates which banks should be refreshed. FIG. 2 illustrates the value of the three-bit field of an Extended Mode Register and the corresponding banks that are refreshed for a four-bank SDRAM implementation. For example, for a four bank SDRAM: a binary value of "000" in the Extended Mode Register refreshes all four banks; a binary value of "001" refreshes two banks, in one embodiment banks 0 and 1 are refreshed; and a binary value of "010" refreshes one bank, in one embodiment bank 0 is refreshed. A binary value of "101" refreshes a half (½) of a single bank, which is bank 0 in one embodiment. A binary value of "110" refreshes a quarter (¼) of a single bank, which is bank 0 in one embodiment. Rows 206, 208, and 210 are values reserved for future use (RFU), such as, alternative bank configurations or other memory commands.

Therefore, in one aspect of the claimed subject matter the system reduces power consumption based on reducing the number of banks or fractional portions of a bank that are refreshed. Another aspect of the claimed subject matter allows for the SDRAM to partition the data into various banks to facilitate the refresh operation.

Figure 5:
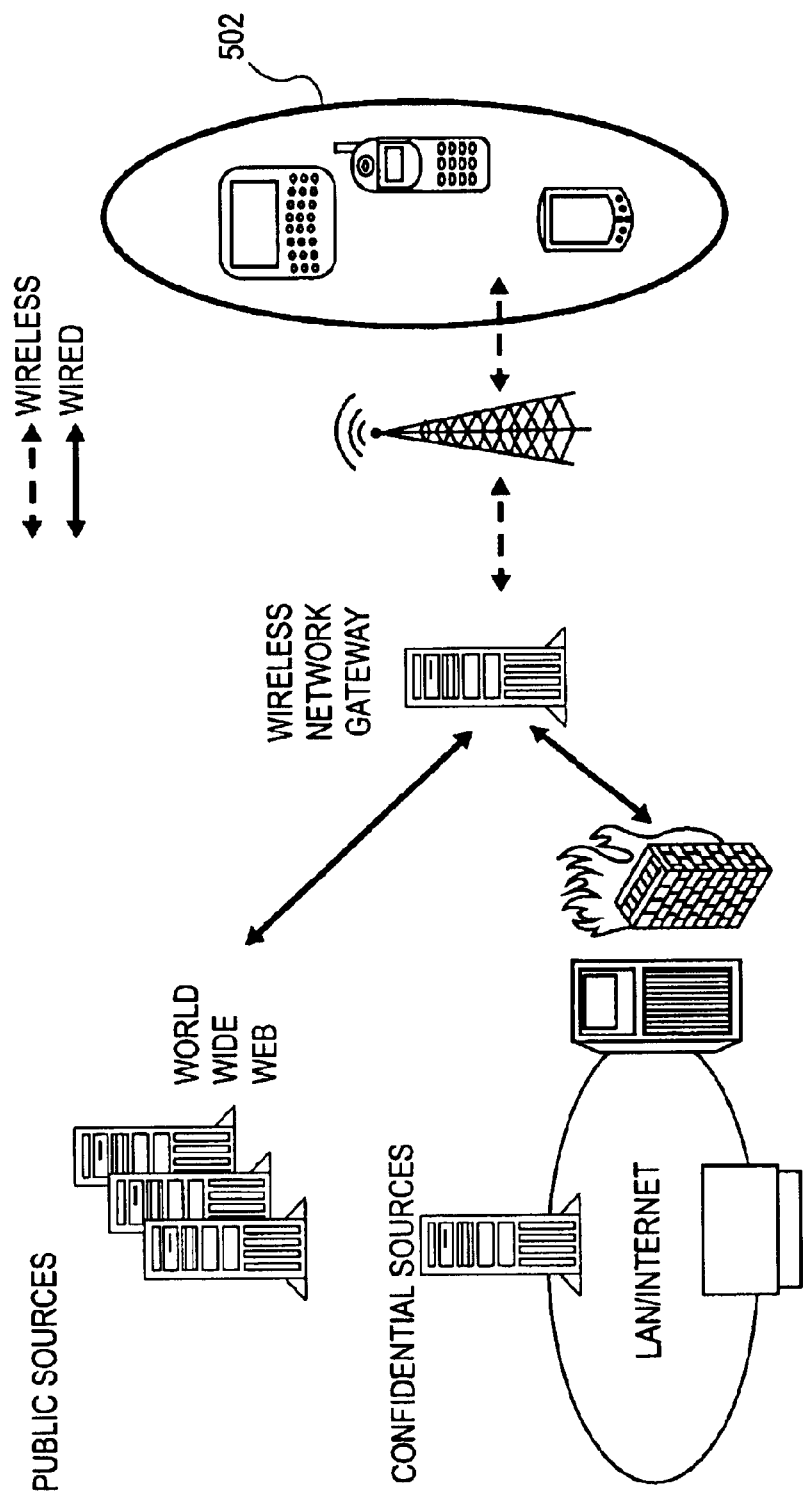
FIG. 5 is a schematic diagram of a network in accordance with one embodiment.

In one embodiment, the claimed subject matter is incorporated into a communication or wireless device and/or implemented with Intel® XScale™ micro architecture and Intel® Personal Internet Client Architecture (Intel® PCA) and is discussed further in FIGS. 3, 4, and 5.

FIG. 3 is a schematic diagram of a computing system in accordance with one embodiment. The schematic represents a flexible design implementation for communication products. In one embodiment for a single processor, logic blocks 302 and 304 represents a modular process wherein the communication processor and application processor may be logically separated. Thus, only one communication processor may be employed for a wireless protocol, and one application processor for a set of applications.

The communication processor 302 is designed for a particular wireless protocol. For example, the protocol specific logic is designed for a plurality of existing wireless standards such as personal digital cellular (PCS), personal digital cellular (PDC), global system for mobile communications (GSM), time division multiple access (TDMA), and code division multiple access (CDMA). The protocol specific logic can support a variety of standards such as IS-136, IS-95, IS-54, GSM1800 and GSM1900.

Communication processor 302 comprises, but is not limited to, a digital signal processor (DSP), a microprocessor, and memory, and peripherals. The application processor 304, comprises, but is not limited to, a microprocessor, memory and peripherals. The application processor may be general purpose and re-programmable. Also, it is capable of executing native binaries in the system, or from another communication product, or from a network. Thus, the application processor is coupled to the communication processor and is logically separated. Therefore, each processor can be developed in parallel rather than the typical serial process.

In one embodiment, the communication processor and application processor may be manufactured on a silicon wafer. However, the processors may operate independently and may have different operating systems. In another embodiment, the communication processor and application processor may be coupled to a common memory controller, which in turn may be coupled to a common memory. Alternatively, each processor may integrate their respective memories. For example, processors may have memory residing on the processor die, rather than having a separate memory. Examples of various memories that may be integrated into each processor are flash memory, static random access memory, and dynamic random access memory.

Although the subject matter is not limited in scope in this respect, Intel® XScale™ micro architecture and Intel® Personal Internet Client Architecture (Intel® PCA) may support a modular implementation as illustrated in FIG. 3. Also, the architectures may support a variety of features, such as a browser to access Internet content and applications, a user interface for allowing interaction with content and applications that include speech, graphics, video, and audio. The architectures may have a file system to manage and protect access to applications, communications, and network code. The architectures may allow for radio interface to transmit and receive from a wireless carrier or service bearer. Further, the architectures may allow for system management for the application processor's operating system kernel, user applications, and the communications processor's real time operating system functions, and content or data payload. Of course, the claimed subject matter is not limited in this respect.

FIG. 4 is a schematic diagram of a computing system in accordance with one embodiment. The block diagram 402 illustrates an integrated implementation of an application and communication processor. In one embodiment, block diagram 402 is utilized in a system with multiple processors. The block diagram comprises, but is not limited to, a digital signal processor (DSP), a microprocessor, and memory, peripherals, a microprocessor, memory, and peripherals. In one aspect, FIG. 4 differs from FIG. 3 in that a single integrated logic processor 402 supports both the application and communication functions. In contrast, FIG. 3 is a modular design and illustrates two processors to individually support either the communication or application functions.

Although the subject matter is not limited in scope in this respect, Intel® XScale™ micro architecture and Intel® (Personal Internet Client Architecture (Intel® PCA) may support an integrated implementation as illustrated in FIG. 4. Also, the architectures may support a variety of features, such as a browser to access Internet content and applications, a user interface for allowing interaction with content and applications that include speech, graphics, video and audio. The architectures may have a file system to manage and protect access to applications, communications, and network code. The architectures may allow for radio interface to transmit and receive from a wireless carrier or service bearer. Further, the architectures may allow for system management for the application processor's operating system kernel, user applications, and the communications processor's real time operating system functions, and content or data payload. Of course, the claimed subject matter is not limited in this respect.

FIG. 5 is a schematic diagram of a network in accordance with one embodiment. In one embodiment, the previously described system for reducing power consumption in FIG. 2 and the modular implementation for communication products and architectures described in FIGS. 3 and 4 may be implemented in various communication products as depicted in FIG. 5. For example, the communication products may include, but is not limited to, Internet tablets, cellular phones, personal digital assistants, pagers, and personal organizers. Also, the communication products may receive information via a wired or wireless connection.

Of course, the claimed subject matter is not limited in this respect. For example, one skilled in the art will appreciate the claimed subject matter may also include systems that provide low power consumption and use batteries as a power source. Alternatively, the claimed subject matter may also include a system or boards that employ thermal dissipation. One example includes a rack-mount of servers with multiple boards plugged into rack-mounted enclosures. The boards are closely spaced and may consume large amounts of power. Therefore, the claimed subject matter may improve the thermal dissipation by reducing the power consumption.

Although the claimed subject matter has been described with reference to specific embodiments, this description is not meant to be construed in a limiting sense. Various modifications of the disclosed embodiment, as well as alternative embodiments of the claimed subject matter, will become apparent to persons skilled in the art upon reference to the description of the claimed subject matter. It is contemplated, therefore, that such modifications can be made without departing from the spirit or scope of the claimed subject matter as defined in the appended claims.

What is claimed is:

1. A system comprising:
    a processor;
    a memory, coupled to the processor, with a plurality of banks; and
    the system to instruct the memory to store a plurality of information in at least one of the plurality of banks based at least in part on a data type of the information and for the memory to execute a refresh operation based at least in part on the data type of the information.

2. The system of claim 1 wherein the memory is a low-power synchronous dynamic random access memory.

3. The system of claim 1 wherein the refresh operation is a partial array self refresh.

4. The system of claim 1 wherein the system is at least one of a personal digital assistant, a cellular phone, an Internet tablet, a personal computer system.

5. The system of claim 1 wherein the data type is at least one of a working storage type that is used during execution of a program, or a long-term type that is used indefinitely.

6. The system of claim 2 wherein the low-power synchronous dynamic random access memory comprises an Extended Mode Register.

7. The system of claim 5 wherein the refresh operation is executed on the plurality of banks which store the long-term data type.

8. An article comprising:
    a storage medium having stored thereon instructions, that, when executed by a computing platform, result in execution of a refresh operation by:
    partitioning at least one of a plurality of memory banks based at least in part on a data type; and
    refreshing at least a fractional portion of one of the plurality of memory banks based at least in part on the data type.

9. The article of claim 8, wherein said storage medium further has stored instructions thereon that, when executed, result in setting a three bit field of an extended mode register of a low-power synchronous dynamic random access memory.

10. The article of claim 8, wherein the data type is either a working storage type that is used during execution of a program or a long-term type that is used indefinitely.

11. A method comprising:
    partitioning at least one of a plurality of memory banks based at least in part on a data type;
    setting a value in a register; and
    refreshing at least one of the plurality of memory banks based at least in part on the value.

12. The method of claim 11 wherein the register is an extended mode register.

13. The method of claim 11 wherein the plurality of memory banks reside in a low-power synchronous dynamic random access memory.

14. The method of claim 11 wherein the value is a three bit field and indicates one, two or four memory banks to be refreshed.

* * * * *

UNITED STATES PATENT AND TRADEMARK OFFICE
CERTIFICATE OF CORRECTION

PATENT NO. : 6,738,861 B2
DATED : May 18, 2004
INVENTOR(S) : Lawrence

It is certified that error appears in the above-identified patent and that said Letters Patent is hereby corrected as shown below:

Column 5,
Line 16, delete "(Personal" and insert -- Personal --.

Signed and Sealed this

Twenty-fourth Day of August, 2004

JON W. DUDAS
*Director of the United States Patent and Trademark Office*